United States Patent
Lam et al.

(10) Patent No.: US 9,317,078 B2
(45) Date of Patent: Apr. 19, 2016

(54) STORAGE DEVICE BACKPLANE WITH PENETRATING CONVECTION AND COMPUTER FRAMEWORK

(71) Applicant: Super Micro Computer Inc., San Jose, CA (US)

(72) Inventors: Lawrence K. W. Lam, San Jose, CA (US); Ruei-Fu Weng, San Jose, CA (US); Thompson Cheuk-Wai Tang, San Jose, CA (US); Richard S. Chen, San Jose, CA (US)

(73) Assignee: SUPER MICRO COMPUTER INC., San Jose, CA (US)

( * ) Notice: Subject to any disclaimer, the term of this patent is extended or adjusted under 35 U.S.C. 154(b) by 124 days.

(21) Appl. No.: 14/245,590

(22) Filed: Apr. 4, 2014

(65) Prior Publication Data
US 2015/0163964 A1    Jun. 11, 2015

(30) Foreign Application Priority Data

Dec. 9, 2013  (TW) .............................. 102223095 U

(51) Int. Cl.
| | |
|---|---|
| *H05K 7/20* | (2006.01) |
| *G06F 1/18* | (2006.01) |
| *G06F 1/20* | (2006.01) |
| *H05K 7/14* | (2006.01) |
| *G11B 33/12* | (2006.01) |
| *G11B 33/14* | (2006.01) |

(52) U.S. Cl.
CPC *G06F 1/187* (2013.01); *G06F 1/20* (2013.01); *G11B 33/128* (2013.01); *G11B 33/1426* (2013.01); *H05K 7/1487* (2013.01); *H05K 7/20154* (2013.01); *H05K 7/20727* (2013.01)

(58) Field of Classification Search
CPC ........... G06F 15/173; G06F 1/16; G06F 1/20; G06F 1/187; H05K 7/14; H05K 7/20; H05K 7/20136; H05K 7/20154; H05K 7/2039; H01R 9/05
USPC ............... 361/676–678, 679.46–679.54, 684, 361/688–723, 831; 709/223; 257/712, 257/721–722; 439/581; 165/80.2, 80.4, 165/104.33, 185
See application file for complete search history.

(56) References Cited

U.S. PATENT DOCUMENTS

| | | | | |
|---|---|---|---|---|
| 2010/0259899 | A1* | 10/2010 | Facusse | ............. H05K 7/20809 361/709 |
| 2013/0329364 | A1* | 12/2013 | Kameno | ............ H05K 7/20563 361/697 |

* cited by examiner

*Primary Examiner* — Courtney Smith
*Assistant Examiner* — Zhengfu Feng
(74) *Attorney, Agent, or Firm* — Chun-Ming Shih; HDLS IPR Services

(57) ABSTRACT

A storage device backplane with penetrating convection and a computer framework with the storage device backplane are disclosed. The storage device backplane includes an integration board, an operation board and a heat dissipation unit. The integration board has a first surface for electrically connecting the storage device group. The operation board is superposed on and electrically connected to a second surface of the integration board and is provided that the operation board includes an electronic heating active element (EHAE) and an airflow hole set around the EHAE. The heat dissipation unit includes a heat absorb portion and multiple fins set on the heat absorb portion. The heat absorb portion makes a thermal contact with the EHAE. The fins laterally extend to cover the airflow hole. Airflow passages are formed between the fins corresponding to the airflow hole.

9 Claims, 6 Drawing Sheets

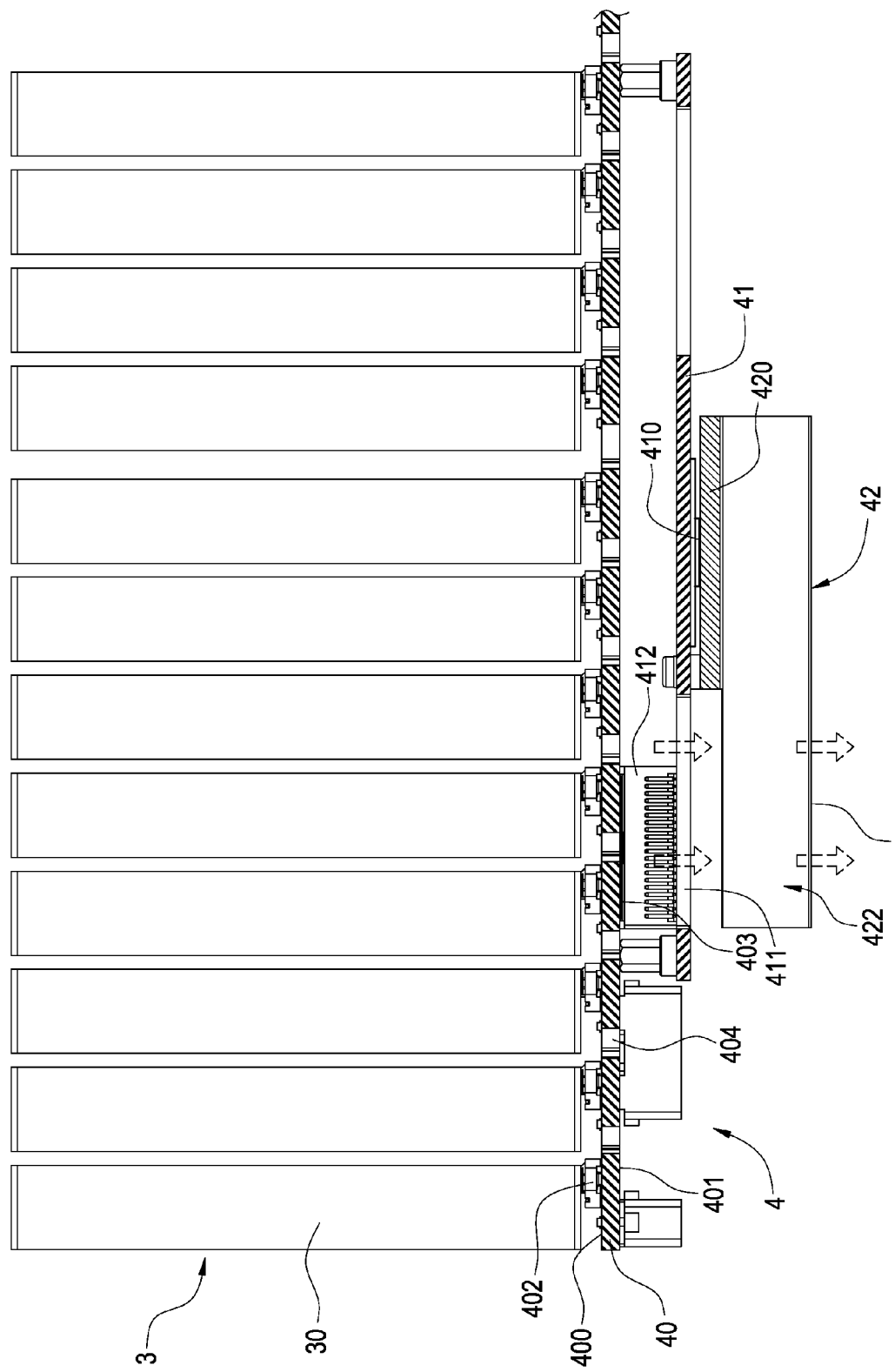

STORAGE DEVICE BACKPLANE WITH PENETRATING CONVECTION AND COMPUTER FRAMEWORK

BACKGROUND OF THE INVENTION

1. Technical Field

The invention relates to a computer, particularly to a storage device backplane with penetrating convection and a computer framework.

2. Related Art

With the development of network technology and industry, modern server systems must provide more and more storage capacity. Thus, a sever system may contain numerous storage devices (e.g. Hard Disk Drives, or Solid State Drives) connecting to the motherboard of the server system. Usually, multiple storage devices are arranged in an array and connected by a storage device backplane to be integrated into a server housing. Being said that, the storage device backplane is functioned as the bridge of multiple storage devices and the motherboard of the server system.

However, the data amount transmitting in the server is increasing significantly due to the growing capacity of the storage devices. The storage device backplane is further required to integrated with some processors, ICs, or chipsets to manage the data traffic. Such the processor or chipset, as the active component, generates a large amount of heat during the operation. Together with the heat generated from storage devices, the rising temperature may cause the Server malfunction or shut down. To reduce the heat accumulation, in the current practice, the storage device backplane must be provided with a cooler or heat sink. Nevertheless, the cooler or heat sink has its limit and the heat-dissipation performance is not satisfied by the industry.

SUMMARY OF THE INVENTION

The invention is to provide a storage device backplane with penetrating convection and a computer framework, which can provide a great effect of heat dissipation to the storage device backplane by a penetrating airflow passage.

In one aspect, the storage device backplane for electrically connecting between a motherboard and a storage device group of a server includes an integration board, an operation board and a heat dissipation unit. The storage device backplane includes an integration board, an operation board and a heat dissipation unit. The integration board has a first surface for electrically connecting the storage device group. The operation board is superposed on and electrically connected to a second surface of the integration board and is provided that the operation board includes an electronic heating active element (EHAE) and an airflow hole set around the EHAE. The heat dissipation unit includes a heat absorb portion and multiple fins set on the heat absorb portion. The heat absorb portion makes a thermal contact with the EHAE. The fins laterally extend to cover the airflow hole. Airflow passages are formed between the fins corresponding to the airflow hole.

In another aspect, the storage device backplane for electrically connecting between a motherboard and a storage device group of a computer includes a board and a heat dissipation unit. The board has a first surface for electrically connecting the storage device group and a second surface including an electronic heating active element (EHAE) and an airflow hole set around the EHAE. The heat dissipation unit includes a heat absorb portion and multiple fins on the heat absorb portion. The heat absorb portion makes a thermal contact with the EHAE. The fins laterally extend to cover the airflow hole. Airflow passages formed between the fins corresponding to the airflow hole.

In still another aspect, a computer framework of the invention includes the motherboard, the storage device group, and the storage device backplane electrically connecting between the motherboard and the storage device group.

BRIEF DESCRIPTION OF THE DRAWINGS

FIG. 6 is a sectional view of the storage device backplane of the invention and the corresponding storage devices.

DETAILED DESCRIPTION OF THE INVENTION

Figure 1:
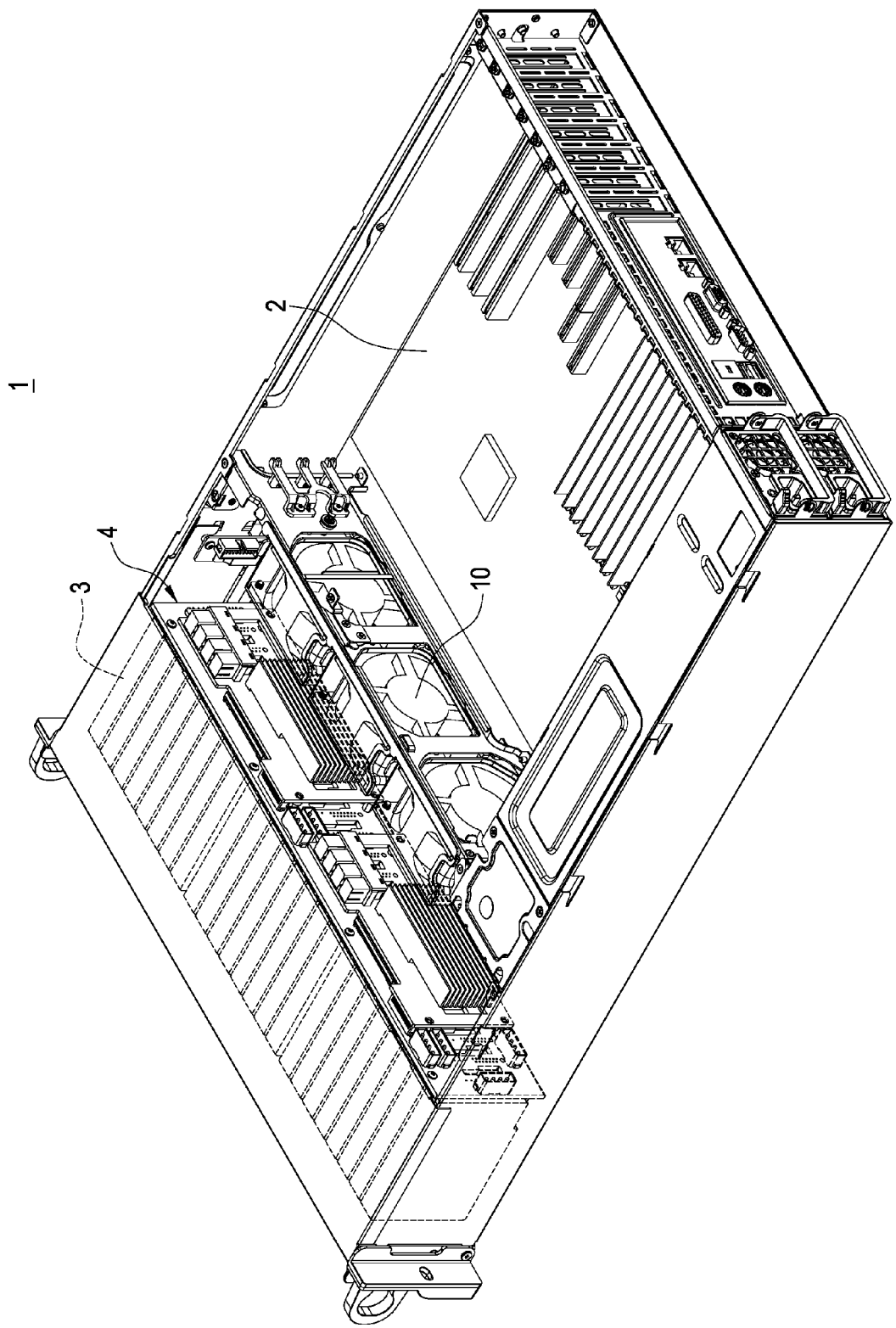
FIG. 1 is a perspective view of the invention applied in a server.

Please refer to FIG. 1. The invention provides a storage device backplane with penetrating convection and a computer framework thereof. The computer framework in the present invention could be a server system 1, including a motherboard 2, a storage device group 3, and a storage device backplane 4 electrically connecting between the motherboard 2 and the storage device group 3.

Figure 2:
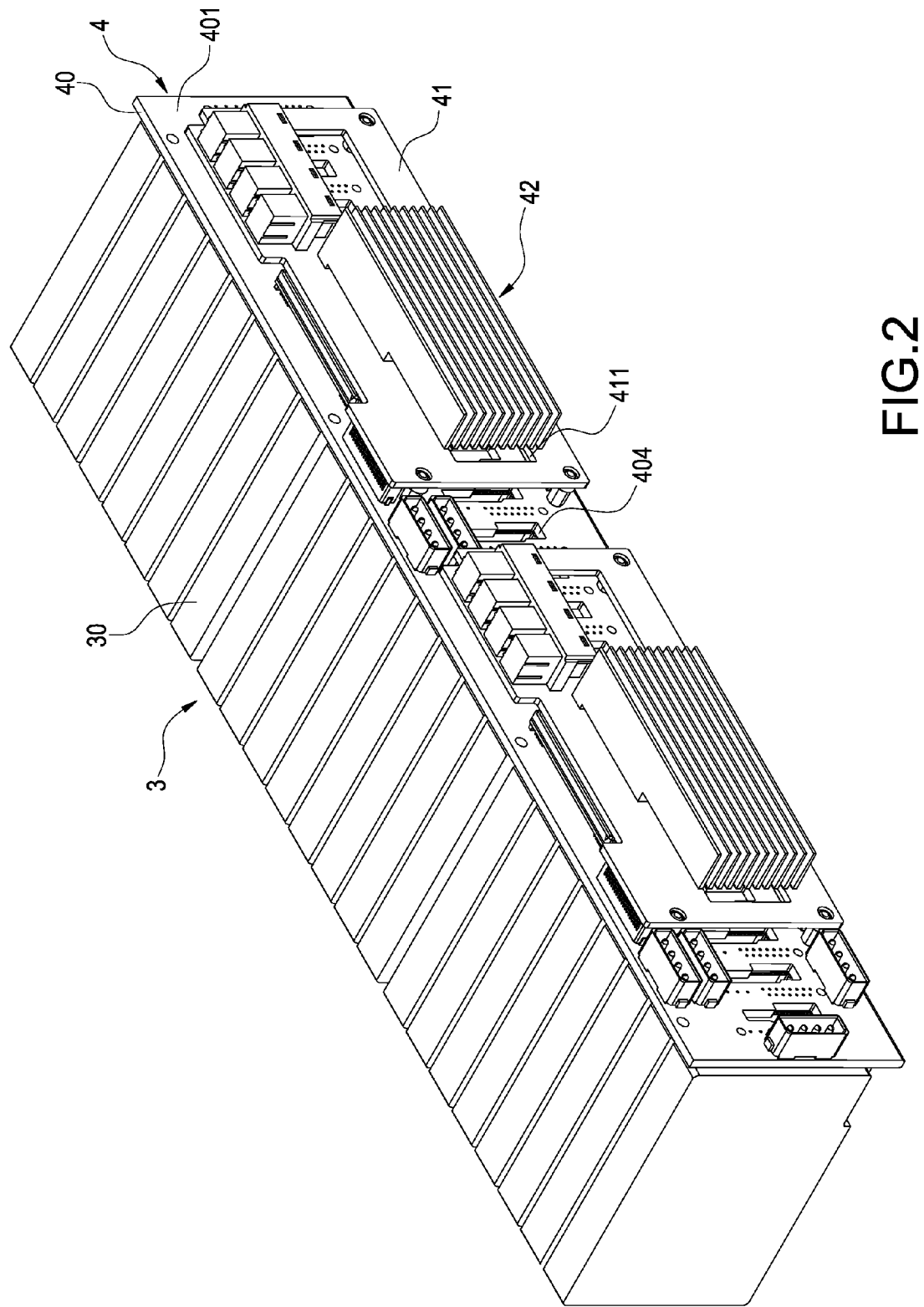
FIG. 2 is a schematic view of the storage device backplane of the invention and corresponding storage devices.
Figure 3:
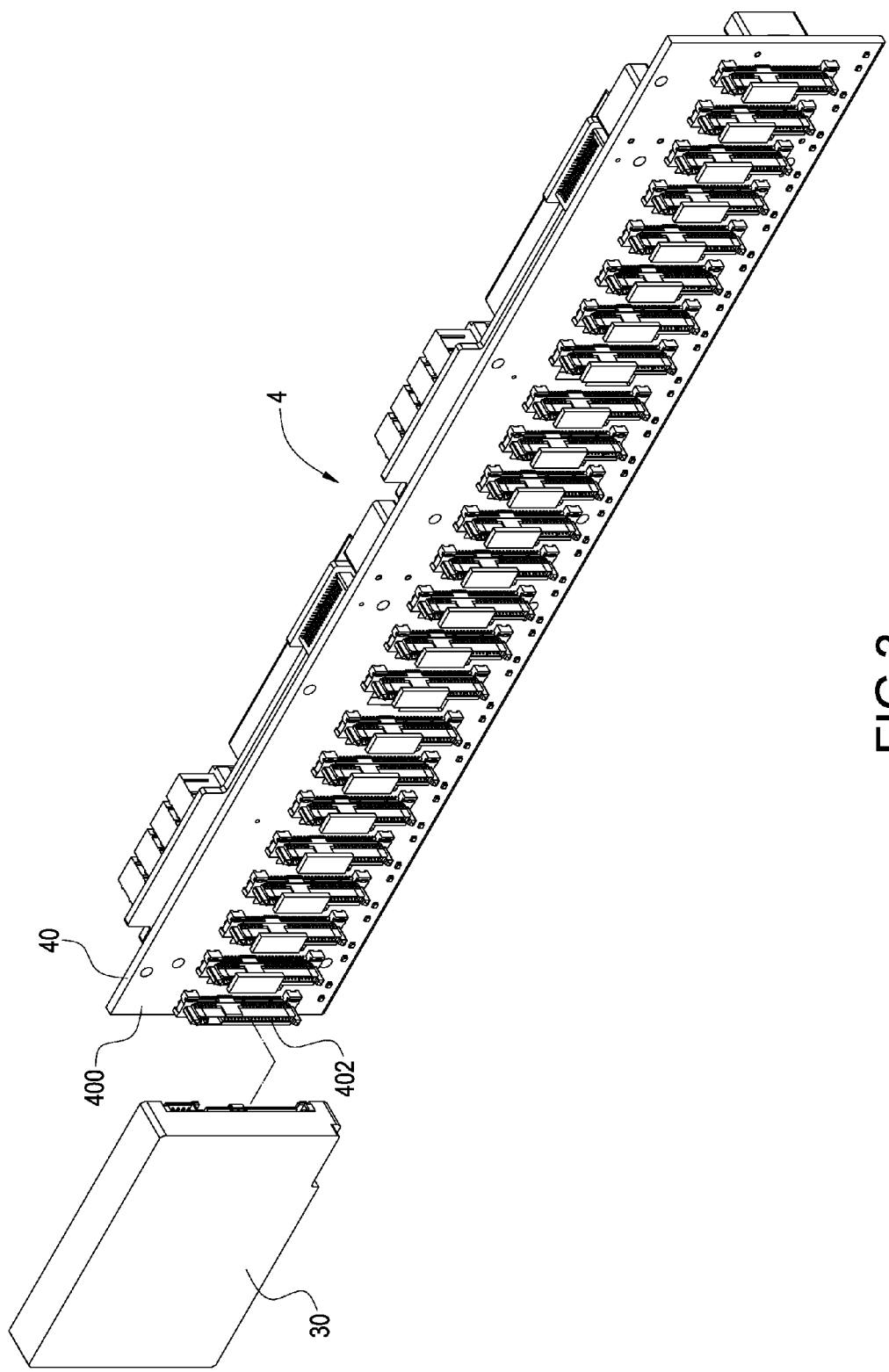
FIG. 3 is an exploded view of the storage device backplane of the invention and the corresponding storage devices.
Figure 4:
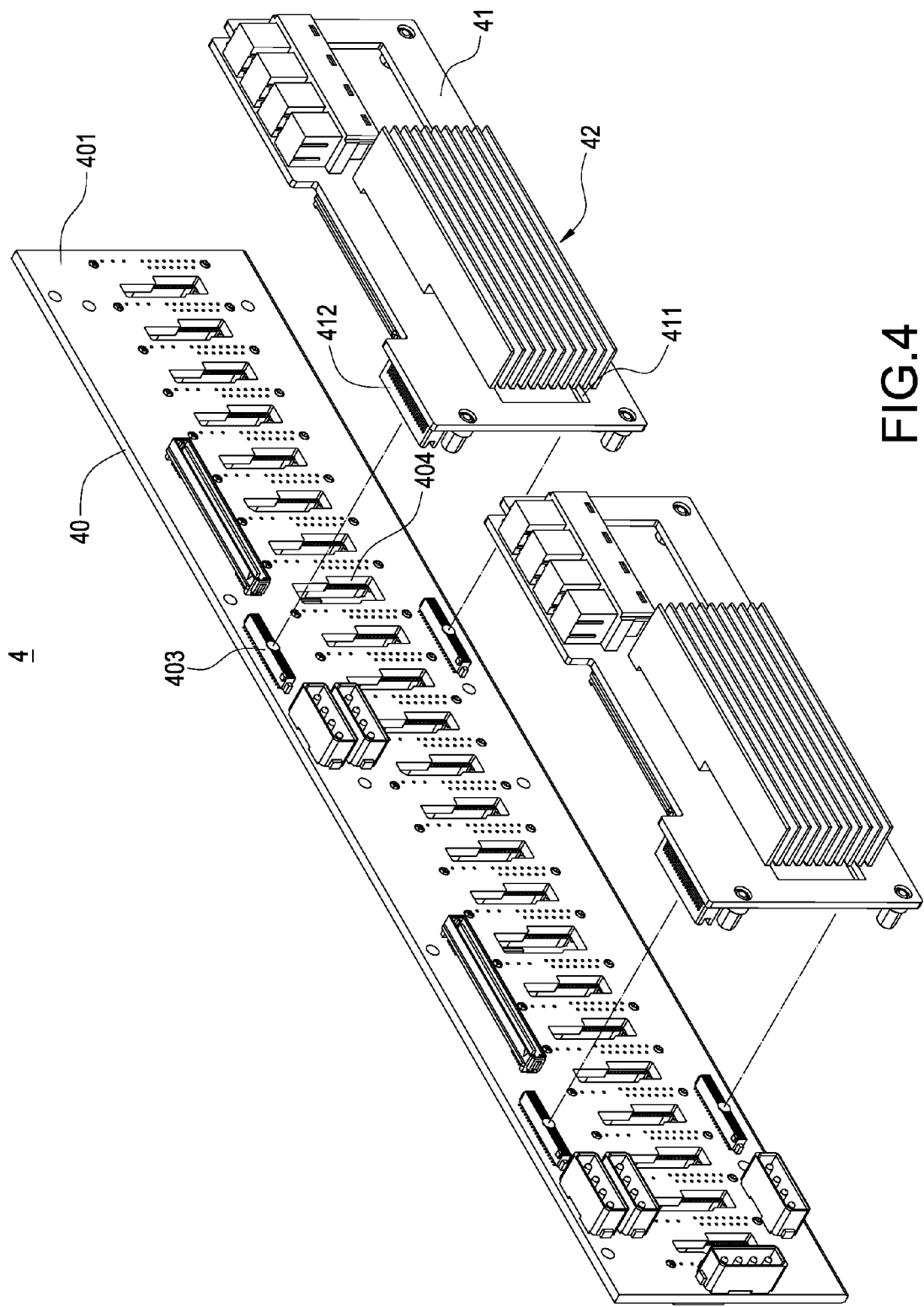
FIG. 4 is an exploded view of the storage device backplane of the invention and operation board.

Please refer to FIGS. 2-4. The storage device backplane 4 includes an integration board 40; an operation board 41; and a heat dissipation unit 42. The integration board has two surfaces 400, 401. As shown in FIG. 3, the surface 400 of the integration board 40 is used for electrically connecting to the storage device group 3. The surface 400 is provided with multiple slots 402 corresponding to the storage device group 3. The storage device group 3 is composed of a plurality of storage devices 30, which separately connect to the corresponding slots 402. Please note that, the storage devices 30 can be embodied by the well-known Hard Disk Drive ("HDD"), Solid State Drive ("SDD"), or any device for storage purpose.

As shown in FIG. 4, the other surface 401 of the integration board 40 is superposed on the operation board 41 with electric connection. The surface 401 is provided with a first board connector 403 corresponding to the operation board 41 for connecting a second board connector 412 of the operation board 41. Additionally, the integration board 40 may be further provided with vents 404 corresponding to the storage devices in position.

Figure 5:
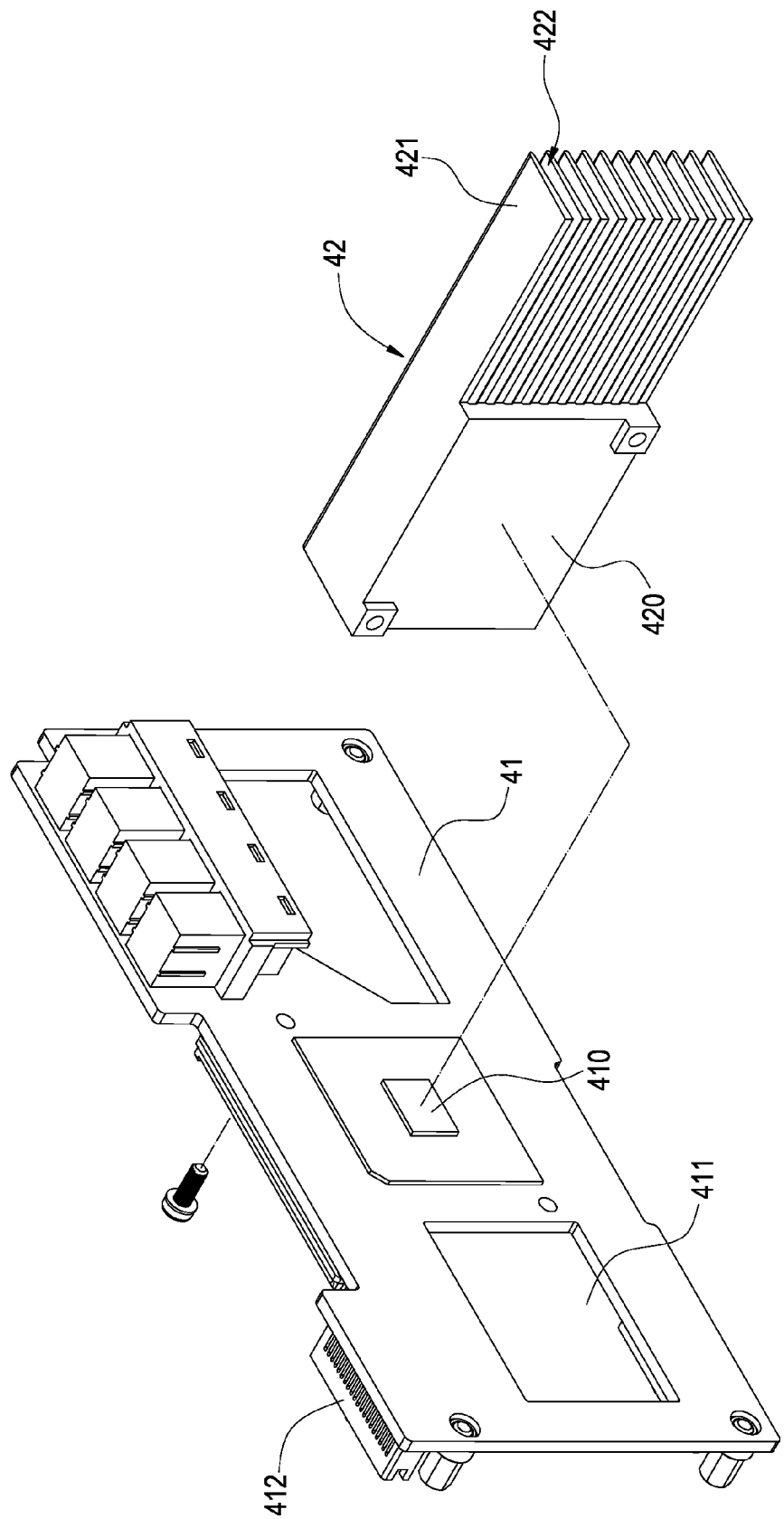
FIG. 5 is an exploded view of the operation board of the storage device backplane and the heat dissipation unit.

Please refer to FIGS. 4 and 5. The operation board 41 may be plural depending on actual requirements and is provided with an electronic heating active element (EHAE) 410. In the practice, the EHAE could be a chipset, a controller, a storage device expander, or a host bus adapter ("HBA"). These are only examples of the EHAE, and are not meant to be taken as limitations. An airflow hole 411 is arranged near the EHAE 410 and may also be plural. As mentioned, the EHAE 410 could be any of well-known active control units or chips, which will generate a large amount of heat. In this embodiment, the EHAE 410 is a control or operation chip of the storage device. The heat dissipation unit 42 could be embodied by an aluminum extrusion heat sink. The heat dissipation unit 42 includes a heat absorb portion 420 and fins 421 formed on the heated portion 420. The heat absorb portion 420 makes a thermal contact with the EHAE 410. The fins 421 laterally extend to cover the airflow hole 411. Please refer to FIG. 6. Airflow passages 422 are thereby being formed within the fins 421 and corresponding the airflow hole 411. The airflow passages 422 will allow the airflow to go through the storage device group 3, the vents 404, and the heat dissipation unit 42; and take away the heat generated from the EHAE 410.

As a result, the storage device backplane with penetrating convection and a server thereof can be obtained.

As shown in FIG. 6, because the operation board 41 has the airflow hole 411 and the airflow passages 422 corresponding with the airflow hole 411, a penetrating convection effect can be obtained. This embodiment in the current invention can prevent the EHAE 410 from overheating. Furthermore, the vents 404 may provide a heat dissipation effect to the storage devices 30 of the storage device group 3. Please refer back to FIG. 1. The server 1 may be provided with fans 10 arranged between the motherboard 2 and storage device backplane 4 for cooling the motherboard and storage devices 30 of storage device group 3. The air pushed by the fans also passes through the vents 404, airflow hole 411 and airflow passage 422 for cooling the fins 421 and the whole heat dissipation unit 42. Thus, the heat dissipation unit 42 can dissipate the heat from the EHAE 410 and accomplish a maximum performance of unit fan cooling. Of course, the fans 10 may draw airflow by either of sucking in or exhausting out.

Additionally, any other embodiment in the current invention may further integrate the integration board 40 and the operation board 41 into a single board. In other words, the storage device backplane 4 has only one board. Two surfaces of this single board are connected to the storage device group 3 and the EHAE 410, respectively. The airflow hole 411 is disposed in the board near the EHAE 410. Of course, the operation board 41 can be directly connected to the storage device group 3 to omit the integration board 40.

It will be appreciated by persons skilled in the art that the above embodiments have been described by way of example only and not in any limitative sense, and that various alterations and modifications are possible without departure from the scope of the invention as defined by the appended claims.

What is claimed is:

1. A storage device backplane for electrically connecting between a motherboard and a storage device group of a server, comprising:
    an integration board, having a first surface for electrically connecting the storage device group;
    an operation board, superposed on and electrically connected to a second surface of the integration board, provided that the operation board comprises an electronic heating active element (EHAE) and an airflow hole set around the EHAE; and
    a heat dissipation unit, comprising a heat absorb portion and multiple fins set on the heat absorb portion, wherein the heat absorb portion makes a thermal contact with the EHAE, the fins laterally extend to cover the airflow hole, and airflow passages formed between the fins corresponding to the airflow hole,
    wherein the integration board comprises a plurality of vents set corresponding to the airflow hole and the airflow passages.

2. The storage device backplane of claim 1, wherein the operation board is plural in number.

3. The storage device backplane of claim 1, wherein the airflow hole is plural in number and set around the EHAE.

4. The storage device backplane of claim 1, wherein the storage device group comprises at least one storage device, and the first surface of the integration board comprises at least one slot for being inserted by the corresponding storage device.

5. A computer framework comprising:
    a motherboard;
    a storage device group comprising at least one storage device;
    a storage device backplane, electrically connecting between the motherboard and the storage device of the storage device group, and comprising:
        an integration board, having a first surface for electrically connecting the storage device group;
        an operation board, superposed on and electrically connected to a second surface of the integration board, provided that the operation board comprises an electronic heating active element (EHAE) and an airflow hole set around the EHAE; and
        a heat dissipation unit, comprising a heat absorb portion and multiple fins set on the heat absorb portion, wherein the heat absorb portion makes a thermal contact with the EHAE, the fins laterally extend to cover the airflow hole, and airflow passages formed between the fins corresponding to the airflow hole; and
    at least a fan arranged between the motherboard and the storage device backplane.

6. The computer framework of claim 5, wherein the integration board comprises a plurality of vents set corresponding to the storage devices, the airflow hole, and the airflow passages respectively.

7. The computer framework of claim 5, wherein the first surface of the integration comprises at least one slot for being inserted by the corresponding storage device.

8. The computer framework of claim 5, wherein the operation board is plural in number.

9. The computer framework of claim 5, wherein the airflow hole is plural in number and set around the EHAE.

* * * * *